United States Patent [19]

Akulow

[11] Patent Number: 5,378,545
[45] Date of Patent: Jan. 3, 1995

[54] REMOVABLE SNAP-ON CARD STIFFENER

[75] Inventor: Orest B. Akulow, Villa Park, Ill.

[73] Assignee: AG Communication Systems Corporation, Phoenix, Ariz.

[21] Appl. No.: 42,485

[22] Filed: Apr. 2, 1993

[51] Int. Cl.⁶ ............................................. H05K 1/18
[52] U.S. Cl. ................................... 428/573; 428/598; 269/903; 361/748
[58] Field of Search ............... 248/225.2, 225.1, 221.2; 228/180.1; 29/423; 361/759, 801, 802, 748, 752, 809; 264/900, 903; 428/582, 571, 573, 598, 595, 603

[56] References Cited

U.S. PATENT DOCUMENTS

| | | | |
|---|---|---|---|
| 2,576,865 | 11/1951 | Vanderveld | 248/221.2 |
| 3,810,433 | 5/1974 | Posner | 361/802 |
| 3,851,222 | 11/1974 | Michalak et al. | 361/757 |
| 3,990,582 | 11/1976 | Schindel | 248/221.2 |
| 4,227,238 | 10/1980 | Saito | 361/801 |
| 4,452,359 | 6/1984 | Koppensteiner | 361/752 |
| 4,533,978 | 8/1985 | Walter | 361/752 |
| 4,971,281 | 11/1990 | Steinbeck | 248/225.2 |
| 4,988,577 | 1/1991 | Jamieson | 361/748 |
| 5,086,371 | 2/1992 | Grammas et al. | 269/903 |
| 5,186,377 | 2/1993 | Rawson et al. | 228/180.1 |
| 5,198,279 | 3/1993 | Beinhaur et al. | 269/903 |

FOREIGN PATENT DOCUMENTS

| | | | |
|---|---|---|---|
| 204818 | 9/1955 | United Kingdom | 248/225.2 |
| 2181302A | 4/1987 | United Kingdom | 361/748 |
| WO92/15187 | 9/1992 | WIPO | 361/748 |

*Primary Examiner*—John Zimmerman
*Attorney, Agent, or Firm*—Gregory G. Hendricks

[57] ABSTRACT

A removable stiffener, which is made of titanium so that it will not be wetted by solder, consists of a thick, straight center member with wedge-shaped feet evenly spaced along its length. A latching pin is included on one end. The stiffener also includes flanges made of thinner stock, running the length of the stiffener on both sides. These flanges strengthen the center member and hold it perpendicular to the card on which the stiffener is installed. The stiffener requires a one-half inch wide channel on the card and a special pattern of slots. To install the stiffener, the feet are inserted part-way into the slots with the latching pin of the stiffener oriented near the latching slot of the card. The card is then bent gently away from the stiffener while the stiffener is being pushed forward so that the latching pin and the latching slot align and engage. When the card springs back the stiffener is latched in place.

1 Claim, 5 Drawing Sheets

REMOVABLE SNAP-ON CARD STIFFENER

FIELD OF THE INVENTION

The present invention relates to the manufacturing of printed circuit cards and more particularly to a removable card stiffener used only during the actual manufacturing process.

BACKGROUND OF THE INVENTION

Problems are sometimes experienced with printed circuit card panels that are made of thin material, or those that have extensive routing patterns or large cutouts. These panels may sag, bow, or warp during assembly due to the heat of automated soldering methods such as wave soldering or vapor phase reflow.

When extra mechanical stiffness or support is needed after assembly as well, standard card stiffeners are riveted to the card and become a permanent part of the assembly. In cases, however, requiring only temporary extra stiffness, such as when a large panel will be cut or routed into several smaller cards after assembly, or to prevent a thin panel from warping in the solder wave, a riveted-on stiffener must either be left on as a now unnecessary part of the assembly or, to reuse it, be removed by drilling out the rivets. Stiffeners attached with screws also require extra work to remove.

Removable card edge stiffeners can be used to provide temporary support but they can only be used on the leading or trailing edges of the card. In a large panel, the center of the panel may also require support.

Therefore it is the objective of the present invention to provide a removable snap-on card stiffener that can be snapped onto a card panel and provide extra stiffness in the interior of the panel or wherever it is needed. After use, it call easily be removed and reused on other panels.

SUMMARY OF THE INVENTION

In order to accomplish the objective of the present invention there is provided a removable stiffener that consists of a thick, straight center member with wedge-shaped feet evenly spaced along its length. A latching pin is included on one end. The stiffener also includes flanges made of thinner stock, running the length of the stiffener on both sides. These flanges strengthen the center member and hold it perpendicular to the card on which the stiffener is installed. The flanges are spot welded to the center member.

The stiffchef requires a one-half inch wide channel on the card and a special pattern of slots. To install the stiffener, the feet are inserted part-way into the slots with the latching pin of the stiffener oriented near the latching slot of the card. The card is then bent gently away from the stiffener while the stiffener is being pushed forward so that the latching pin and the latching slot align and engage. When the card springs back the stiffener is latched in place.

DESCRIPTION OF THE DRAWINGS

A better understanding of the invention may be had from the consideration of the following detailed description taken in conjunction with the accompanying drawings, in which.

DESCRIPTION OF THE PREFERRED EMBODIMENT

Figure 1:
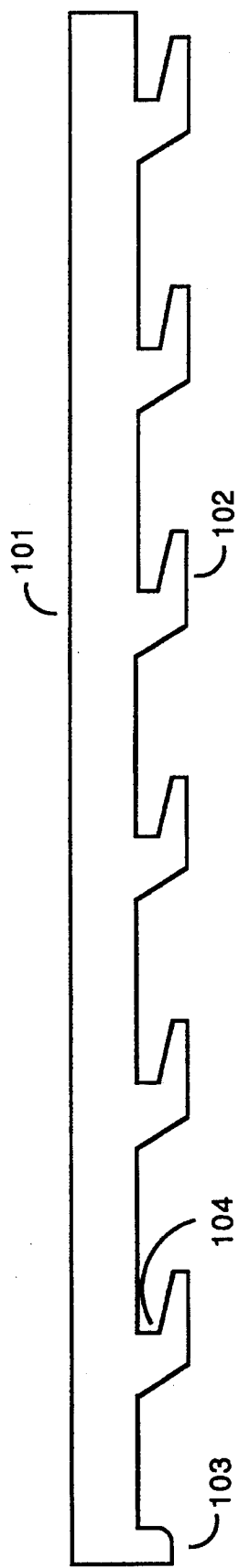
FIG. 1 is a two-dimensional drawing of the present invention.

Referring to FIG. 1, the stiffener, which is made of titanium so that it will not be wetted by solder, consists of a thick, straight center member 101 with wedge-shaped feet 102 evenly spaced along its length. A latching pin 103 is included on one end. The stiffener also includes flanges (see 201 FIG. 4) made of thinner stock, running the length of the stiffener on both sides. These flanges strengthen the center member and hold it perpendicular to the panel on which the stiffener is installed. The flanges are spot welded to the center member.

Figure 2:
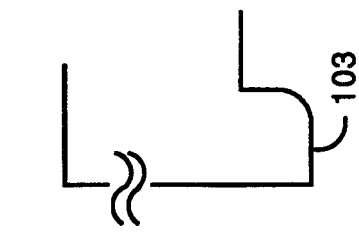
FIG. 2 is an exploded view the latching pin on one end of the present invention.

Still referring to FIG. 1 in the present embodiment, the distance from the left edge of the latching pin 103 to the surface 104 is 1.5 inches. All subsequent intervals between each foot is 2 inches. The latching pin 103 is shown in greater detail in FIG. 2.

Figure 3:
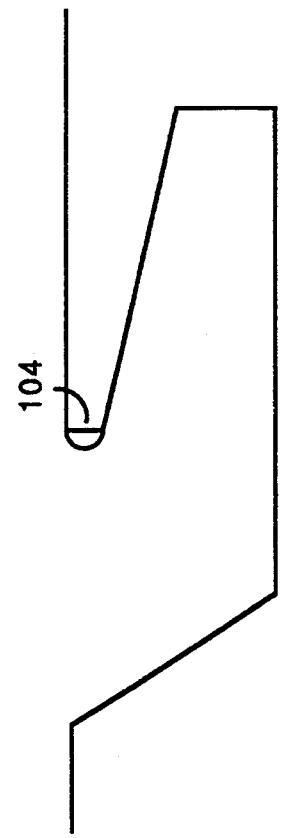
FIG. 3 is an exploded view of a wedge-shaped foot used by the present invention.

Referring next to FIG. 3, a wedge-shaped foot is shown in greater detail. As shown in the FIG., surface 104 can be either a straight line as depicted in FIG. 1 or a curved line as shown in FIG. 3. Depending on the actual manufacturing technique used to create the stiffener, the curved surface may be easier to make.

Figure 4:
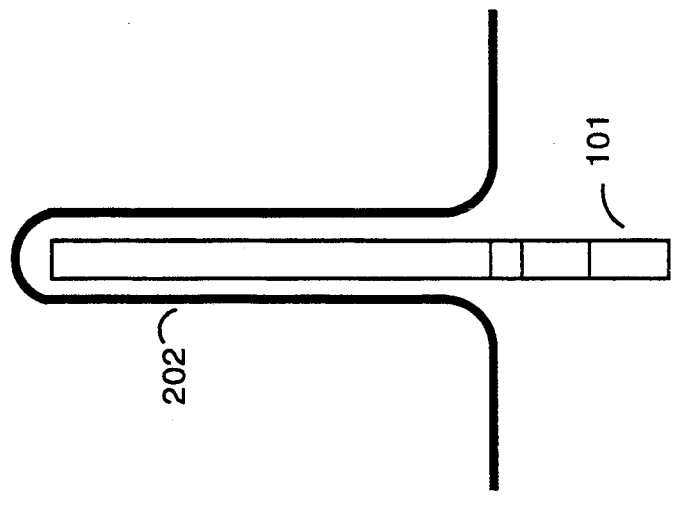
FIG. 4 shows a first embodiment of the present invention.
Figure 5:
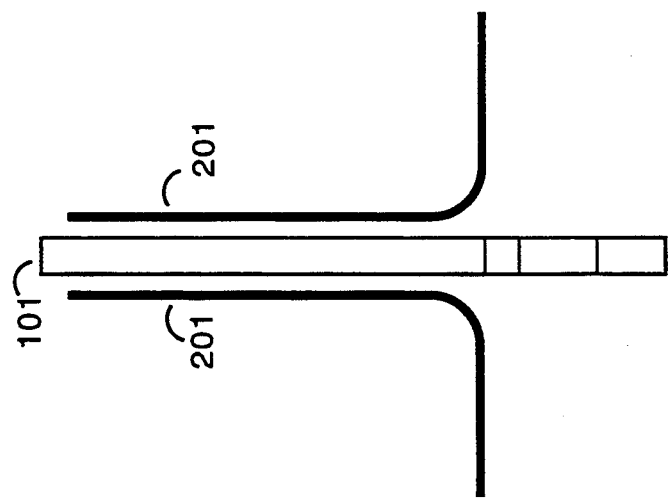
FIG. 5 shows a second embodiment of the present invention.

FIGS. 4 and 5 show two-possible arrangements to attach the flange material to the center post material. In both embodiments, the center material is 0.06 inches thick while the flange material in 0.02 inches thick. These dimensions are not meant to be limiting only to provide an idea of the present embodiment's size. In FIG. 4 two "L" shaped pieces 201 are spot welded to the center stiffener 101. In FIG. 5 the flange is constructed from a single piece 202 being wrapped around the center stiffener 101. Other methods of creating the flanges are possible, but the two methods shown here are the most common methods. However, the actual manufacturing technique used to create the flanges is not important to the present invention and could be several other acceptable methods.

Figure 6:
FIG. 6 shows the pattern of holes that would be used to receive the snap-on card stiffener.

The stiffener requires a one-half inch wide channel on the component side of the card and a special pattern of slots as shown in FIG. 6. To install the stiffener, the feet are inserted part-way into the long slots with the latching pin of the stiffener oriented near the latching slot of the card. The panel is then bent gently away from the stiffener while the stiffener is being pushed forward so that the latching pin and the latching slot align and engage. When the card springs back the stiffener is latched in place.

The wedge-shaped feet allow the stiffener to be used with various thicknesses of card stock. The distance between the latching slot and the other slots, as shown in FIG. 6, is function of the card thickness so that the stiffener is held tightly against the card when the latching pin engages. Referring to FIG. 6, the distance from 601 to 602 is X while the distance from 601 to 603 is X+2.0 and from 601 to 604 is X+4.0. These distances are measured from the left center point of 601 to the right center point of 602, 603, and 604. X depends on the thickness of the printed circuit card as described below.

Figure 7:
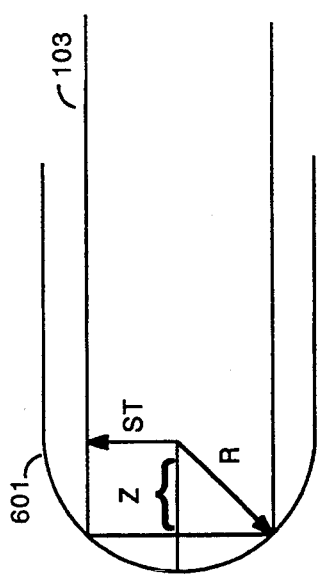
FIG. 7 is a detailed drawing of the latching pin dimensions.

In FIG. 7, the latching pin and hole relationship is shown in greater detail. When the latching pin (103 of FIG. 1) is placed in its receiving hole 601 of FIG. 6, the rear of latching pin makes contact with the left side of the hole as shown in FIG. 7. From FIG. 7 the distance from the center point of the left curvature of 601 (X) must be determined. Using simple Pythagorean theorem:

$$Z = \sqrt{R^2 - ST^2} \qquad \text{(eq. 1)}$$

With the present embodiment, R=0.047", ST=0.030" Thus:

$$Z = 0.036'' \qquad$$

Figure 8:
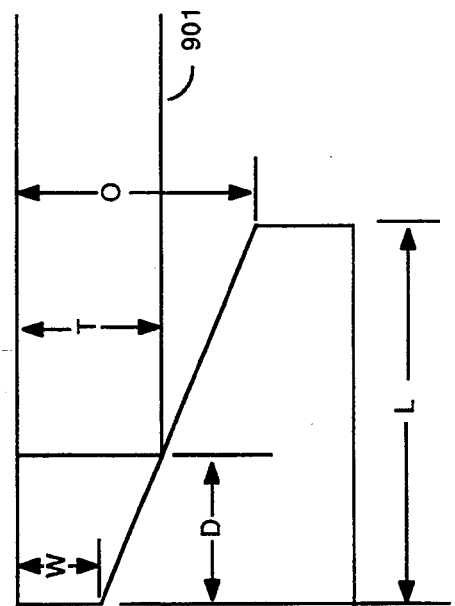
FIG. 8 is a detailed drawing of the wedge-shaped foot dimensions.

Next, FIG. 8 shows a wedge-shaped foot with a printed circuit card 901 wedged into the foot. To determine (X), the distance (D) must be determined, Of course this distance depends on the thickness (T) of the printed circuit card 901. Here:

$$D = (T - W)\left(\frac{L}{O - W}\right) \qquad \text{(eq. 2)}$$

Assuming as stated above, that the distance from latching pin 103 to wedge shaped foot 104 is 1.5 inches, then:

$$X = 1.5'' - Z + D - Z = 1.428'' + D \qquad \text{(eq.3)}$$

Thus, knowing the dimensions of the stiffener and the card thickness, the distance between the mounting holes can be calculated.

Figure 9:
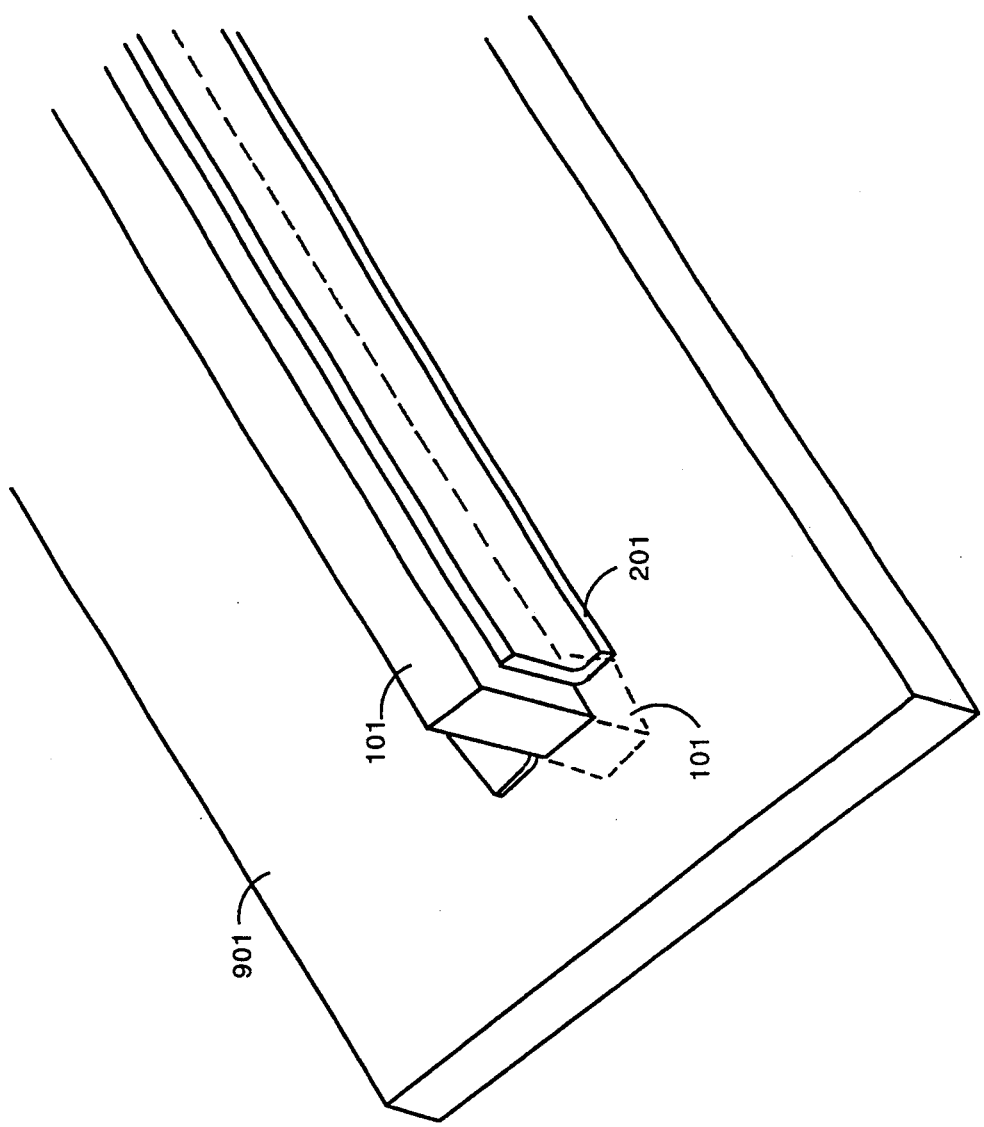
FIG. 9 is a perspective view of the present invention being used on a printed circuit card.

FIG. 9 shows the present invention in place. As shown the flanges 201 strengthen the center member and hold it perpendicular to the panel 901 on which the stiffener is installed.

Although the preferred embodiment of the invention has been illustrated, and that form described, it is readily apparent to those skilled in the art that various modifications may be made therein without departing from the spirit of the invention or from the scope of the appended claims.

What is claimed is:

1. A removable stiffener for providing stiffness to a card, said card having a top and a bottom, said card having a plurality of holes extending from said top to said bottom, said removable stiffener comprising:

a center rod having a rectangle cross-section, said center rod having a longitudinal length perpendicular to said rectangle cross-section, said center rod having a bottom, a first side and a second side, and a first end;

a plurality of wedge-shaped feet firmly attached to said bottom of said center rod along said longitudinal length, said plurality of wedge-shaped feet extend through said plurality of holes in said card thereby allowing center rod to provide additional stiffness to said card;

a first flange having a first face and a second face, where said first face is perpendicular to said second face, said first face of said first flange attached to said first side of said center rod, when said plurality of wedge-shaped feet extend through said plurality of holes in said card, said second face of said first flange firmly rests against said card;

a second flange having a first face and a second face, where said first face is perpendicular to said second face, said first face of said second flange attached to said second side of said center rod, when said plurality of wedge-shaped feet extend through said plurality of holes in said card, said second face of said second flange firmly rests against said card, said first flange and said second flange prevent rotational movement about said rectangle cross-section of said center rod; and a latching pin firmly attached to said bottom on said first end of said center rod, said latching pin holding said plurality of wedge-shaped feet in said plurality of holes in said card.

* * * * *